(12) United States Patent
Baier

(10) Patent No.: US 6,976,118 B1
(45) Date of Patent: Dec. 13, 2005

(54) METHOD AND SYSTEM FOR PROGRAMMING FPGAS ON PC-CARDS WITHOUT ADDITIONAL HARDWARE

(75) Inventor: Heinz Baier, Sindelfingen (DE)

(73) Assignee: International Business Machines Corporation, Armonk, NY (US)

(*) Notice: Subject to any disclaimer, the term of this patent is extended or adjusted under 35 U.S.C. 154(b) by 660 days.

(21) Appl. No.: 09/637,214

(22) Filed: Aug. 11, 2000

(30) Foreign Application Priority Data

Aug. 11, 1999 (EP) .................................. 99115963

(51) Int. Cl.[7] ........................................... G06F 12/00
(52) U.S. Cl. ...................... 711/103; 711/170; 713/100; 326/39
(58) Field of Search ...................... 711/103, 211, 170, 711/100; 712/37; 365/185.33, 189.02, 230.02; 713/100, 1–2, 104, 8, 14; 710/10, 51, 104, 710/8, 14; 326/37–41, 44, 45, 47, 49–50, 326/101–103

(56) References Cited

U.S. PATENT DOCUMENTS

| | | | | |
|---|---|---|---|---|
| 5,465,106 A | 11/1995 | Keech et al. | ............... | 345/204 |
| 5,628,028 A | 5/1997 | Michelson | ..................... | 710/8 |
| 5,640,107 A | 6/1997 | Kruse | ........................... | 326/38 |
| 5,794,033 A * | 8/1998 | Aldebert et al. | ............. | 713/100 |
| 5,923,614 A | 7/1999 | Erickson et al. | ............ | 365/236 |
| 5,978,862 A | 11/1999 | Kou et al. | ..................... | 710/14 |
| 6,067,615 A * | 5/2000 | Upton | ......................... | 712/37 |
| 6,260,139 B1 * | 7/2001 | Alfke | ............................ | 713/1 |

FOREIGN PATENT DOCUMENTS

| | | |
|---|---|---|
| EP | 99115963.3 | 2/2000 |
| JP | 09 212445 | 8/1997 |
| JP | 11 167544 | 6/1999 |
| WO | 99/34515 | 7/1999 |

* cited by examiner

Primary Examiner—Denise Tran
(74) Attorney, Agent, or Firm—Ference & Associates

(57) ABSTRACT

Programming or updating hardware electronic circuits without manually accessing the circuits is dislcosed. The circuit arrangement includes an EEPROM device, a FPGA device which is accessible via a computer bus system and a MUX element connected between said devices; a PROM device is arranged, inter alia, for comprising control data for proper recognition of the FPGA by the bus system. The MUX element can be controlled to read data from either the PROM device, EEPROM device, or FPGA device. In the method of the present invention, the FPGA is used to program the EEPROM with the schema received from a disk. The MUX is switched to be able to read from the EEPROM and feed the developed schema therein into the FPGA. The PROM is used to deliver the information to the FPGA, which is necessary for the PC-card to be recognized by the BIOS on a first start-up.

3 Claims, 2 Drawing Sheets

METHOD AND SYSTEM FOR PROGRAMMING FPGAS ON PC-CARDS WITHOUT ADDITIONAL HARDWARE

CLAIM FOR PRIORITY

This application claims priority from European Application No. 99115963.3, filed on Aug. 11, 1999, which is hereby incorporated by reference.

FIELD OF THE INVENTION

The present invention relates to the area of programming field programmable gate arrays. In particular, the present invention relates to improve the usage of same during the use by end-users and during development of circuits implementing some new functionality on said field programmable arrays.

BACKGROUND OF THE INVENTION

In general, field programmable arrays, further referred to herein and abbreviated as FPGA, are used to implement some computing functionality which is intended to run basic, hardware related functions used to control the basic functions of computer periphery, which recognizes video screens, printers, network cards, etc.

Further, FPGAs are used in applications which require a vast amount of basic arithmetic computations, e.g., multiplication and addition operations, that have to be performed very quickly in graphic processing applications.

FPGAs are used to implement computational functionality which is implemented in a large number (up to 1 million) of inter-connected circuits. Such vast cicuits are planned and realized with the help of a special hardware, e.g., the hardware device of Byte BlasterMV, which is connected to either the serial or the parallel port of the workstation used in turn as a development platform with dedicated software tools.

This is depicted in FIG. 2, where a PCI card is shown schematically connected to extra hardware 32 external to the PC. Logic 34 is provided for controlling and programming the FPGA 16 with the configuration data to be developed for the FPGA and feeding it with the configuration data necessary for the PCI card to be detected by the bus system on a system start-up. Such prior art development environments require either additional hardware or Programmable Read Only Memory devices, further referred to herein as PROMs. The developed schema containing the new functionality is fed into the PROM which is placed onto the PC-card to be developed comprising the FPGA. After a subsequent POWER-On of the developer's workstation, the PROM controls and performs the configuration of the FPGA. Then, the functionality of the FPGA can be tested during operation. If a further update of the schema is necessary, a new PROM has to be used, as the used one can not be rewritten.

Alternatively, Electrical Erasable PROMs, further referred to herein as EEPROMS are used instead of PROMs. They can be rewritten in case of a further update, however, external hardware is necessary in order to control the write process into the EEPROM.

During development of FPGA functionality, or when an end-user exchanges a PC-card comprising said FPGA due to any update or extension of functionality incorporated in his card, manual access to the concerned card is necessary. In the case of a FPGA developer, manual access is needed to replace at least the PROM used to program the FPGA. In the latter instance, manual access to the concerned card is necessary in order to replace the card by another. The same basically applies when instead of an update, any new functionality is implemented on an FPGA.

Any manual access to PC-cards, however, causes additional work and bears the risk to damage other hardware connected in the casing of the computer, e.g., by statical charges brought to any of a plurality of locations sensitive thereto.

SUMMARY OF THE INVENTION

The present invention broadly contemplates a method and circuit in order to improve the usage of FPGAs during the use by end-users and during development of circuits implementing some new functionality on said FPGAs. In accordance with the present invention, programming and updating hardware electronic circuits is accomplished without manually accessing the circuits.

In accordance with one aspect of the invention, a PROM or a EEPROM device is physically connected onto the concerned card. This device is intended to be accessed serially and to input a serial data stream into the FPGA, which is necessary when the FPGA shall be notified to the bus system of the computer, e.g., a PCI bus, and in order to be able to access a card via a conventional device driver. As mentioned above, the FPGA is automatically configured by the PROM on the next Power-On of the computer which represents a requirement for the PCI-card to be detected properly by the BIOS of the computer.

In another aspect of the present invention, there exists a hardware circuit arrangement comprising an EEPROM device, and a FPGA device which is accessible via a computer bus system and a multiplexer which allows several users to share communication channels such as outgoing phone lines, hereinafter referred to as a MUX element connected between said devices.

Another aspect of the present invention includes a circuit arrangement of the PROM device arranged for comprising control data for proper recognition of the FPGA by said bus system, and which recognizes a compromise to a logic usable to recognize programming a EEPROM device with an EEPROM-FPGA interface like that of Joint Test Action Group (JTAG). In accordance with the present invention, the above mentioned MUX element can be controlled to select either said PROM device or said EEPROM device or said FPGA device for reading data from said devices, in order to properly connect said FPGA to said bus system and to initialize a configuration of said FPGA with the contents comprised of said EEPROM.

In another aspect of the present invention, a method is provided to perform various updates of the FPGA contents without accessing the card physically. In accordance with this method, during a first sequence of steps the FPGA is used to program the EEPROM with the schema received from a disk. Then, the MUX is switched to be able to read from the EEPROM and feed the developed schema programmed therein into the FPGA as it was intended originally. The PROM is just used to deliver the information to the FPGA which is necessary for the PC-card to be recognized by the BIOS on a first start-up. Thus, a characteristic feature of the present invention is that the FPGA device is configured in a double way, first in order to initialize the desired disk communication and then to be re-configured according to the EEPROM contents.

The method and circuit according to the present invention have the advantage, in relation to the method sketched in the discussion of prior art technique in that they allow programming of FPGAs without accessing physically the card comprising the FPGA. Consequently, the average development time is lowered and costs are reduced. A further advantage is that no extra hardware is required external to the computer. Yet, a further advantage is the ability to construct a generic PC-card that can easily be re-programmed in order to perform an extended functionality compared to that before. Or, it is possible to implement a totally different functionality—if desired. Thus, the present invention increases flexibility of FPGA hardware as it is no more dedicated for a sole purpose only.

For a better understanding of the present invention, together with other and further features and advantages thereof, reference is made to the following description, taken in conjunction with the accompanying drawings, and the scope of the invention will be pointed out in the appended claims.

DESCRIPTION OF THE PREFERRED EMBODIMENT

Figure 1:
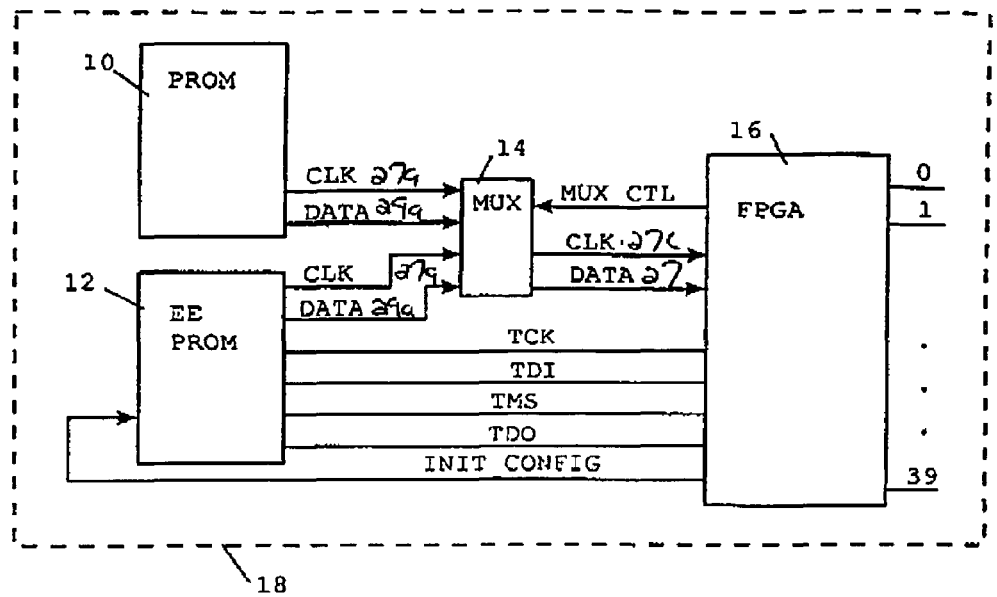
FIG. 1 is a schematic representation of a structural diagram showing the essential elements of the circuit according a preferred embodiment of the present invention.
Figure 2:
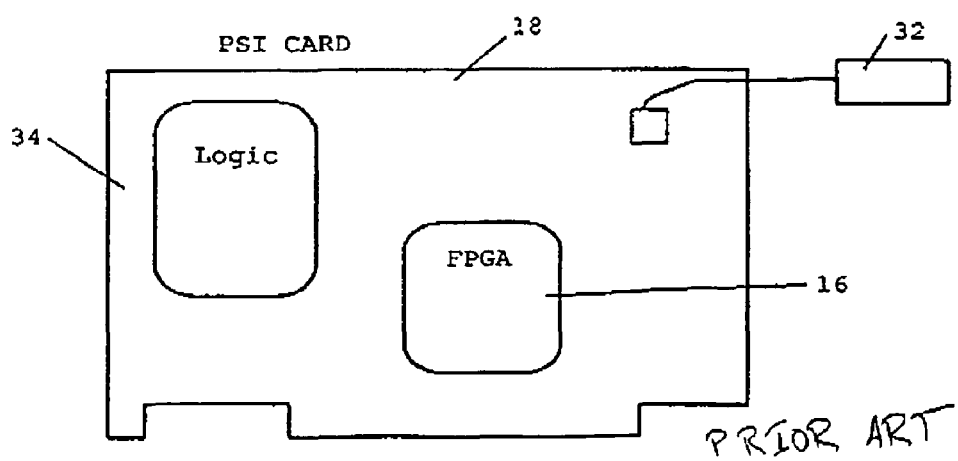
FIG. 2 is a schematic representation of a structural diagram showing the essential elements of a circuit according to prior art.

With general reference to the figures and with special reference now to FIG. 1 the essential elements of the circuit according to the invention are described.

A PROM 10 and an EEPROM 12 are connected via a multiplexer element 14 with an FPGA 16 located on the generic PC-card 18 to be generated according to the present invention. The PC-card 18 is depicted schematically with broken lines. A number of 40 lines are provided at the right side of the FPGA as input/output lines in order to represent the connection to the PCI bus system of the computer.

From both, PROM 10 and EEPROM 12 a clock line 27a CLK and a data line 29a DATA are connected to respective entries of the MUX 14. A clock line 27c and data line 27 are output from the MUX to respective entries in the FPGA 16.

The MUX element 14 can be controlled via a line MUX CTL in order to read data from PROM 10, i.e., when said line is inactive, or from EEPROM 12, when said line is switched active.

Further, there are provided four connections TCK, TDI, TMS and TDO between FPGA 16 and EEPROM 12 in order to program the EEPROM 12 from FPGA 16 as discussed with reference to the prior art cited above.

Further, there is provided a signal line INIT_CONFIG from an output of the FPGA 16 to an input of EPROM 12, the operation of which will be discussed below.

PROM 10 comprises all configuration data necessary to configure the FGPA 16 in order to be recognized by the BIOS as a PCI-bus participating device on a start-up of the computer and to be accessed via a device driver 120. Further, it comprises all logic necessary to program the EEPROM 12 with the JTAG interface as discussed above.

Figure 3:
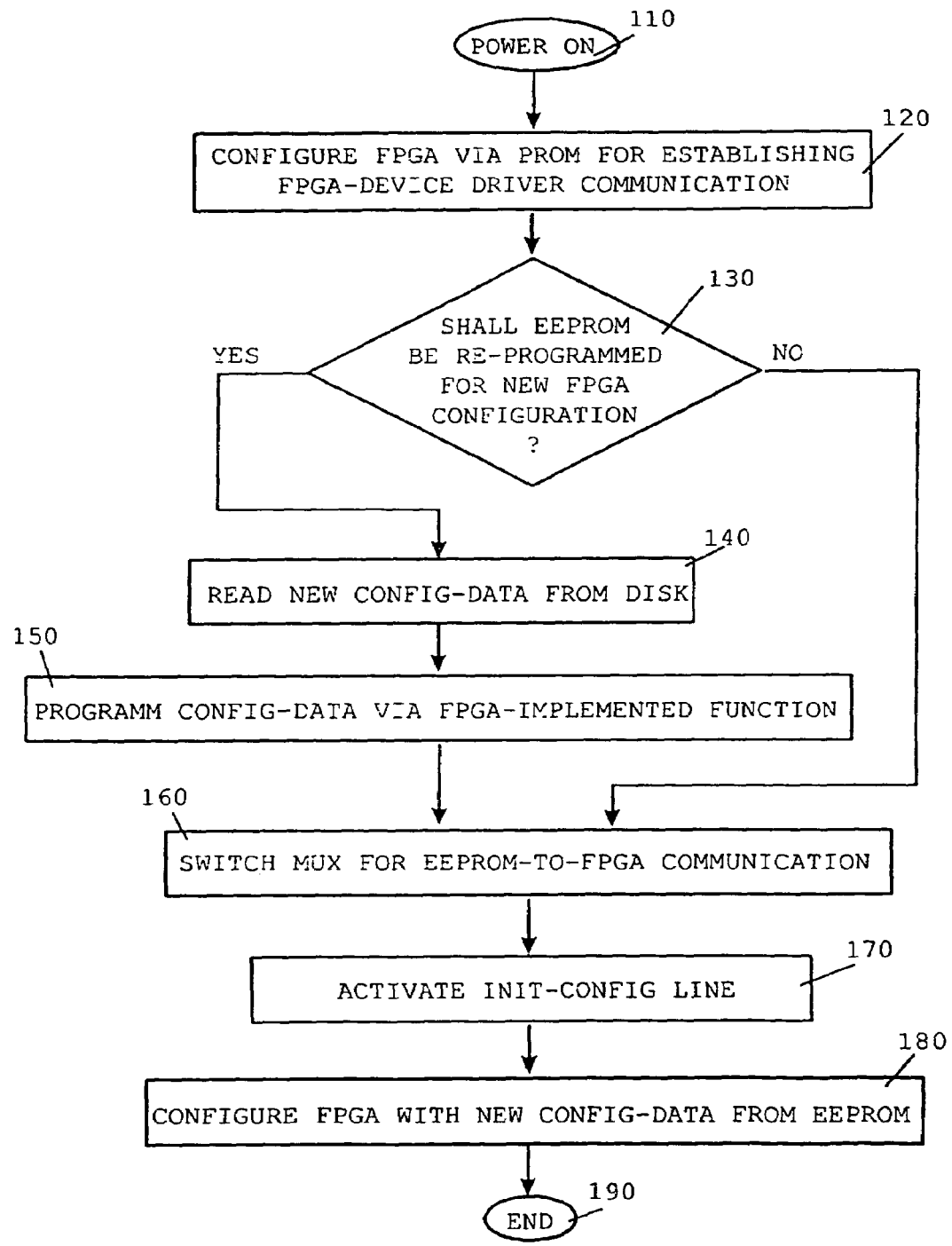
FIG. 3 is a schematic representation of a block diagram showing the essential steps of the method according to a first and a second aspect of the present invention.

Referring now to FIG. 3, the essential steps of programming the EEPROM 12 and the FPGA 16 are shown.

After Power-On, step 110, the FPGA 16 is configured automatically via the PROM 10 contents, step 120. The FPGA 16 signals its presence after being prompted by the BIOS. The FPGA 16 contains the PCI target device function and can thus communicate with a device driver.

In accordance with a first embodiment of the method of the present invention, the EEPROM 12 used to program the FPGA 16 shall be programmed with a new update of FPGA 16 development schema mentioned above, which corresponds to the YES-branch in decision 130. Any prior art device driver reads the schema, which recognizes the configuration data from a disk 140 to where it was written by the schema development tool and programs these data into the EEPROM 12 via the dedicated function implemented in the FPGA 16 which was mentioned above as program config-data via FPGA 16—implemented function 150.

In particular, like in prior art, the dedicated JTAG signals Clock (TCK), Data Input (TDI), Mode selection (TMS) and Data Output (TDO) as depicted in FIG. 1. Thus, the EEPROM 12 programming is completed.

Then, the configuration process for the FPGA 16 with the contents of the EEPROM 12 is triggered by activating the so-called Card_INIT function via the signal line INIT_CONFIG. Said triggering step is controlled by a function implemented in FPGA 16.

In particular, the MUX 14 is switched in step 160 via the line MUX CTL so that the lines CLK and DATA of the EEPROM 12 are fed into the FPGA 16. When the line INIT_CONFIG is actually activated, step 170, the FPGA 16 will be configured with the contents of the EEPROM 12, step 180. Thus, the FPGA 16 programming is completed with step 190. It can be repeated with a new updated version of the schema by simply repeating the steps just described above.

In accordance with a second embodiment of the method of the present invention, the EEPROM 12 is already reprogrammed. Thus, such cases are covered in which the development of a new FPGA 16 configuration schema is completed. In this case the method as depicted in FIG. 3 continues after the start-up procedure, step 110 with PROM 10 involved, step 120, leaves the decision 130 via the NO-branch and continues with step 160 as described above.

In the foregoing specification the invention has been described with reference to specific exemplary embodiments thereof. It will, however, be evident that various modifications and changes may be made thereto without departing from the broader spirit and scope of the invention as set forth in the appended claims. The specification and drawings are accordingly to be regarded as illustrative rather than in a restrictive sense.

It should be noted that the present invention is independent from the bus system in use with the PC hosting the FPGA schema development environment.

What is claimed is:

1. A method for programming field programmable gate arrays (FPGA) operatively connected to a bus system of a computer device with configuration data, the method comprising by the steps of:
   (a) using a device driver to read the configuration data from a storage device operatively connected to the bus system of said computer device;
   (b) providing the configuration data to the FPGA by way of the bus system of said computer device;
   (c) programming the configuration data into an electrical erasable programmable read only memory (EEPROM) connected with said FPGA via a multiplexer, hereinafter referred to as a MUX element, adapted such that the configuration data is capable of being read from the FPGA to the EEPROM;
(d) switching said MUX element such that the configuration data is capable of being read from said EEPROM into said FPGA; and
(e) programming the configuration data from the EEPROM to said FPGA.

2. A hardware circuit arrangement having a programmable read only memory (PROM) device, an electrical erasable programmable read only memory (EEPROM) device, a field programmable grate array (FPGA) device accessible via a computer bus system and a multiplexer, hereinafter referred to as a MUX element, connected between said devices, said circuit arrangement comprising:
(a) a device driver to read configuration data from a storage device operatively connected to the computer bus system into the EEPROM via the FPGA;
(b) said PROM device being arranged for comprising control data for proper recognition of said FPGA by said bus system, and a logic usable for programming said EEPROM device with an EEPROM-FPGA interface;
(c) said MUX element being controllable to permit data to be read from either said PROM device or said EEPROM device, in order to properly connect said FPGA to said bus system and to initialize a configuration of said FPGA with contents comprised of said EEPROM, adapted such that the configuration data is capable of being read from the FPGA to the EEPROM.

3. The circuit arrangement according to claim 2, wherein the circuit arrangement is located on a PC-card detectable by a PC system bus.

* * * * *